United States Patent
Sugai et al.

[11] Patent Number: 5,560,776
[45] Date of Patent: Oct. 1, 1996

[54] PLASMA DISCHARGE GENERATING ANTENNA

[75] Inventors: Hideo Sugai, Aichi-ken; Katsutaro Ichihara, Kanagawa-ken; Nobuaki Yasuda, Kanagawa-ken; Michiko Okubo, Kanagawa-ken, all of Japan

[73] Assignee: Kabushiki Kaisha Toshiba, Kanagawa-ken, Japan

[21] Appl. No.: 304,651

[22] Filed: Sep. 9, 1994

[30] Foreign Application Priority Data

Sep. 10, 1993 [JP] Japan ................... 5-226107

[51] Int. Cl.⁶ ........................................ C23C 16/00
[52] U.S. Cl. ................ 118/723 AN; 118/723 I; 204/192.32; 204/298.34
[58] Field of Search .................. 118/723 I, 723 AN; 204/192.32, 298.34

[56] References Cited

U.S. PATENT DOCUMENTS 4,918,031  4/1990  Flamm et al. ............... 156/643
5,234,529  8/1993  Johnson ...................... 204/298.34
5,387,288  2/1995  Shatas ......................... 118/723 AN

FOREIGN PATENT DOCUMENTS 0156526  6/1990  Japan ......................... 118/723 AN

*Primary Examiner*—R. Bruce Breneman
*Assistant Examiner*—Ramamohan Rao Paladugu
*Attorney, Agent, or Firm*—Finnegan, Henderson, Farabow, Garrett & Dunner, L.L.P.

[57] ABSTRACT

A plasma discharge apparatus includes a chamber in which plasma discharge is produced; an antenna composed of a loop coil formed from an electric conductor which can be supplied with R.F. power so as to produce a high frequency electric field in the chamber; and an electric shield of a shield layer of non-magnetic electrically conductive material which toroidally surrounds the coil and which has openings. The shield layer is grounded and electrically connected to the antenna so as to be a return circuit. The electric shield can be formed from a strip electric conductor toroidally wound to provide a spiral gap opening between turns. The strip can further be toroidally wound over the spiral gap but separated from the underlying strip layer to form a double layer shield.

20 Claims, 7 Drawing Sheets

FIG. 11(a) (NOT SHIELDED)

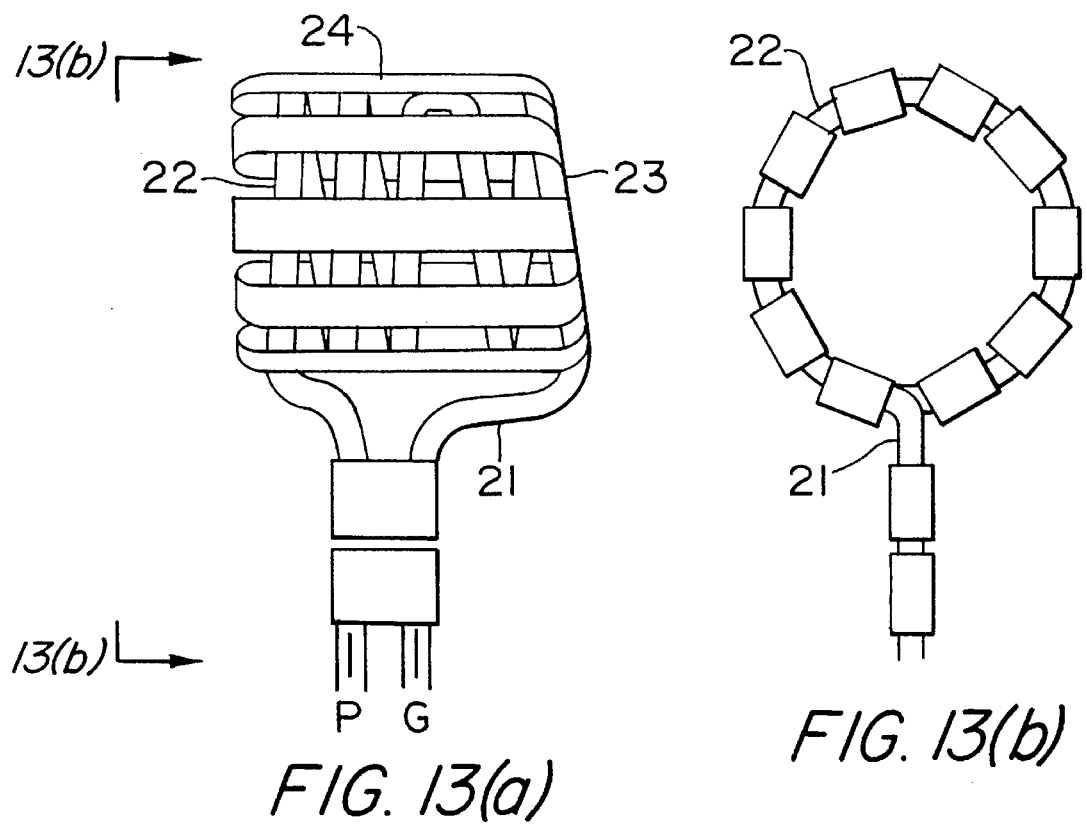
FIG. 13(a)
FIG. 13(b)
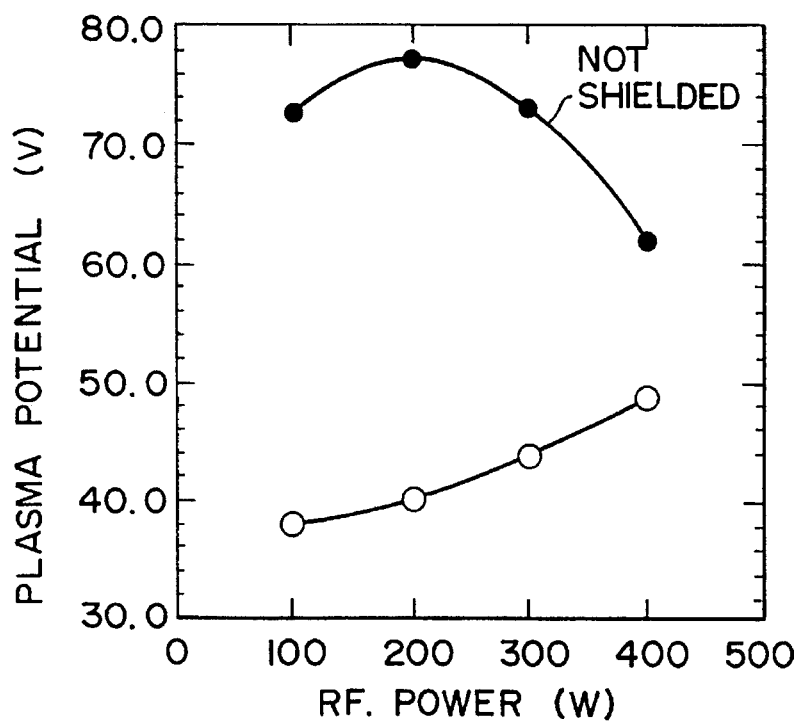
FIG. 14

PLASMA DISCHARGE GENERATING ANTENNA

BACKGROUND OF THE INVENTION

1. Field of the Invention

This invention relates to a plasma discharge generating apparatus which provides a coil-induced plasma and is used for producing a thin film or for etching.

2. Description of the Related Art

Many devices incorporate a thin film made of metal, semi-metal, semiconductor, compounds such as oxide, nitride, carbide or boride or organic compounds such as hydrocarbon, fluorocarbon or siloxane. Such devices can be used for LSIs, magnetic recording devices, optical recording devices, semiconductor lasers, photo-conductive devices, flat panel displays, image sensors, solar cells, and so on.

Methods employing a vapor phase reaction are suitable for producing the thin films of such devices. Such methods include a PVD (physical vapor deposition) method, for example, sputtering method or ion plating method, a CVD (chemical vapor deposition) method, a CDE (chemical dry etching) method and an RIE (reactive ion etching) method. The vapor phase reaction is preferred over a liquid phase reaction for producing fine patterns.

In the vapor phase reaction, a gas is introduced in a chamber and the gas is activated. Then, the activated gaseous material is exposed to a surface of a substrate for etching or deposition.

Conventional activating methods include a thermal-decomposition method such as thermal-CVD, and a photodecomposition method such as photo-CVD. Further, conventional activating methods include a plasma discharging method. In an inductive coupled-type plasma discharge producing apparatus, a loop coil, i.e., an antenna, is provided. A high frequency current, i.e., R.F. power, is supplied to the antenna causing a fluctuating magnetic field and a resulting high frequency circular electric field to be produced in the chamber by electromagnetic coupling. The high frequency electric field causes plasma discharge.

The electric field caused by electromagnetic coupling is composed of only an azimuthal component in an ideal case. However, in actual, conventional apparatus, there is a radial component of the electric field. It is believed that since the antenna has a terminal, the antenna is not a perfect circle, resulting in the unwanted radial component.

A radial electric field causes charged particles to be accelerated in the direction of the antenna. As a result, the antenna itself is sputtered by the charged particles. If the antenna is placed outside of an insulating chamber, the chamber will be sputtered. The sputtering causes contamination and affects the state of plasma discharge and/or the properties of films being deposited.

There is another problem in conventional plasma discharge producing apparatus, namely the increase of an electric potential of the plasma in the case when the antenna is placed inside the chamber. The increased potential frequently causes arcing so that the plasma discharge becomes unstable. For avoiding an increase of the potential of the plasma, the antenna is sealed by an insulator. However, the radial electric field causes the insulator to be sputtered. Therefore, the problem of contamination remains.

In U.S. Pat. No. 4,918,031, a plasma generating apparatus is disclosed which comprises a split metallic shield disposed internally of a coil to shield a plasma region from radial electric fields. However, in U.S. Pat. No. 5,234,529, it is reported that a shield as described in U.S. Pat. No. 4,918,031 while effective to avoid contamination caused by a capacitive coupling between the coil and plasma, can reduce plasma coupling efficiency. The improved apparatus disclosed in U.S. Pat. No. 5,234,529 comprises a longitudinally split, metallic shield disposed within a helical coil and disposed around an internal plasma region. The shield allows a significant capacitive coupling between the coil and the plasma region by the use of multiple slits through the shield.

However, the problem of contamination still remains even with such improved split shields.

SUMMARY OF THE INVENTION

Accordingly, one object of the present invention is to provide a plasma discharge generating apparatus having a loop coil which can reduce the radial electric field.

Another object of the present invention is to provide plasma discharge generating apparatus which can inhibit the increase in the electric potential of the plasma.

These and other objects of the present invention can be achieved by providing an apparatus usable with a source of R.F. power including:

a chamber in which plasma discharge is to be produced;

a loop coil antenna formed from an electric conductor and which can be connected to the source of R.F. power, the antenna being positioned to provide a high frequency electric field in the chamber;

an electric shield including at least one shield layer of a non-magnetic electrically conductive material electrically connected to the antenna to comprise a return circuit, the shield being positioned to toroidally surround the coil, wherein the electric shield comprises an electrically conductive portion and an electrically nonconductive portion; and means for fixing the potential of the shield.

Preferably, the shield layer is formed from at least one strip of non-magnetic electrically conductive material toroidally wound around the antenna leaving gaps between adjacent turns, and the shield is grounded.

It is also preferred that each gap is less than the Debye length of the plasma to be generated.

It is further preferred that a non-magnetic electrically conductive strip be toroidally wound over the gaps formed by the first winding, and radially spaced from the first winding by a separation distance less than the Debye length of the plasma to be generated.

BRIEF DESCRIPTION OF THE DRAWINGS

A more complete appreciation of the present invention and many of the attendant advantages thereof will be readily obtained as the invention becomes better understood by reference to the following detailed description when considered in connection with the accompanying drawings, wherein:

FIG. 11(a) is a schematic graph showing the magnetic field of the embodiment of FIG. 9 without shielding;

FIG. 13(a) is a side view of another embodiment of the present invention;

FIG. 13(b) ms a plain view of the embodiment of FIG. 3(a) in the direction 13(b)—13(b); and FIG. 14 is a graph showing the plasma potential of the embodiment of FIG. 7.

DETAILED DESCRIPTION OF THE PREFERRED EMBODIMENTS

In the present invention, attention has been directed primarily to the inside region of the loop coil of the antenna to reduce the radial electric field component causing contamination, because the plasma density is large inside the loop coil. However, in general, plasma also may exist outside the coil and an electric field caused by the coil exists outside the coil as well. Therefore, to be effective to reduce contamination, the coil is wound with a non-magnetic electrically conductive strip to provide an electric shield leaving a gap between each neighboring turn of the strip. For example, non-magnetic and electrically conductive strips can be composed of Al, Cu, Al based alloys, Cu based alloys, Pt based alloys, non-magnetic stainless steel alloys, Ti based alloys, Au based alloys or Ag based alloys. This shield structure can reduce the outside and inside radial electric field component caused by the antenna. Also, the shield can be constructed from a mesh of the electrically conductive material.

The gap, i.e., an electrically non-conductive area portion of the shield, is necessary to allow generation of the plasma discharge. If there is no gap, both the electric and magnetic fields are shielded so that plasma discharge cannot occur. However, some amount of radial component of the electric field will remain in such a single winding construction due to the gap. In another embodiment which has a double winding structure, the strip is wound around each turn of the coil leaving a gap between neighboring turns, as in the single winding construction, and a further winding over the gaps is provided. In this double winding structure, each turn of the loop coil cannot be "seen" either from the outside of the antenna or from the center of the antenna. As a result, a significantly further reduction in the radial electric field caused by the loop coil can be achieved.

It is not necessary to wind the strip around each turn of the loop coil when the antenna is a helical coil. To produce an electric shield in accordance with the present invention, the strip may be wound toroidally around each of several turns or the whole of the loop coil. Moreover, the same effect of this shield structure can be obtained without winding. For example, an elongated strip and U-shaped strips can be used in combination to provide the shield. The long strip is positioned along the wire composing the coil and the U-shaped strips are disposed toroidally around the wire and electrically connected to the long strip.

Figure 1:
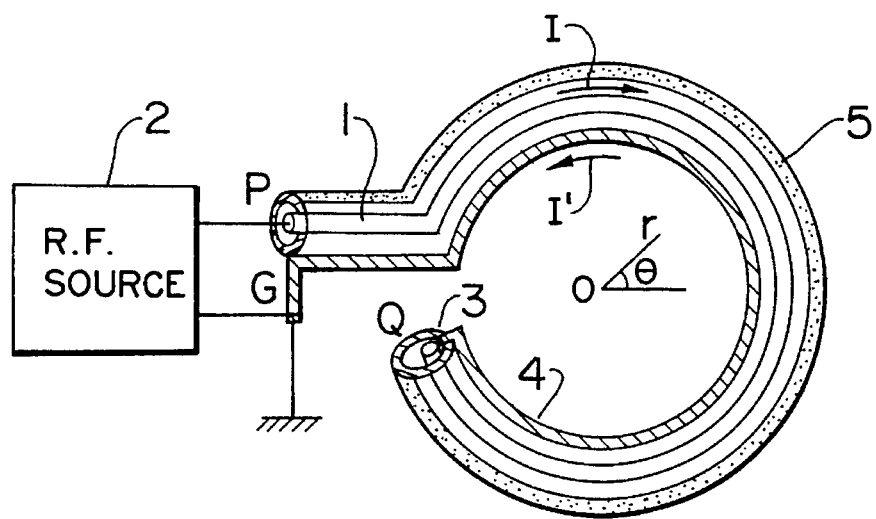
FIG. 1 is an illustrative schematic view of the antenna of an embodiment of the present invention.
Figure 2:
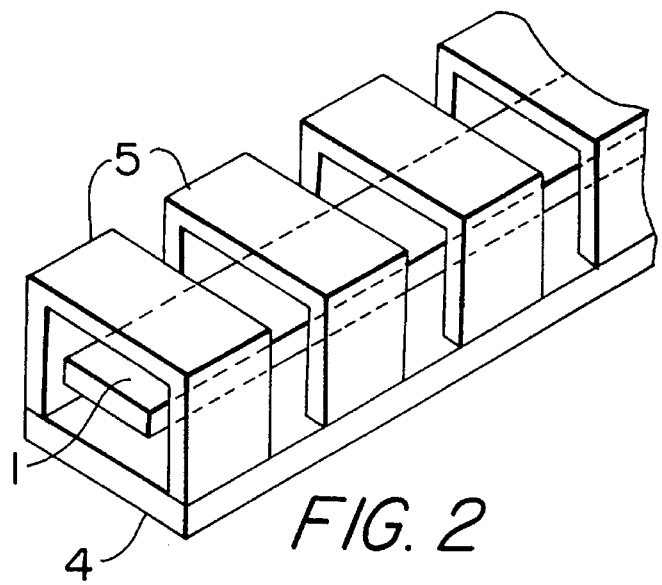
FIG. 2 is a partial detailed view in perspective of another antenna usable in the apparatus of FIG. 1.
Figure 3A:
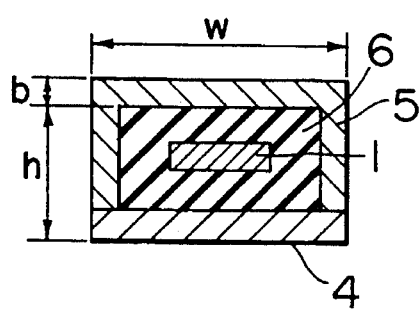
FIG. 3(a) is a sectional view of the antenna of FIG. 2.
Figure 3B:
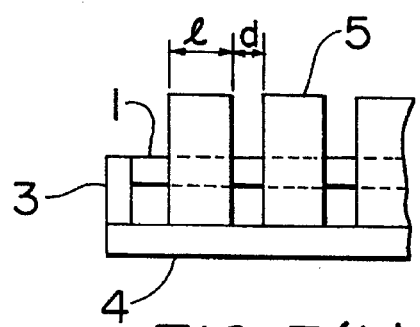
FIG. 3(b) is a side view of the antenna of FIG. 2.

FIG. 1 is an illustrative view of plasma generating apparatus including an antenna provided with an electric shield structure, in accordance with the present invention. FIG. 2 is a partial view in perspective of another antenna usable in the apparatus of FIG. 1, and FIG. 3(a) is a sectional view and FIG. 3(b) is a side view of the antenna of FIG. 2.

With initial reference to FIG. 1, a loop coil 1 is connected to R.F. power source 2 at a coil end portion P. An elongated strip 4 is positioned along the radially inner circumference of loop coil 1 and connected to the coil at another coil end portion Q through a plate 3. An end portion G of elongated strip 4 is connected to the power source 3 and grounded so as to constitute a return circuit, i.e., an induced current I can flow between the point P and the point G through the point Q. However, strip 4 can be set at a potential different from ground if desired, by the use of known constant potential devices. Further, spaced apart curved U-shaped strips 5 are disposed around the coil 1. U-shaped strips 5 can have straight sided segments—see FIG. 2. The gap width between neighboring turns of the U-shaped strips 5 is "d" (see FIG. 3(b)), and each U-shaped strip 5 is electrically connected to elongated strip 4. Therefore, the U-shaped strip is grounded also. The width of the U-shaped strip 5 in a direction along the coil 1 is "1", the thickness of the U-shaped strip 5 is "b", the width of the long strip 4 is "w" and the height of the U-shaped strip 5 is "h", as shown in FIGS. 3(a) and 3(b). The thickness of strip 4 may be equal to the strip 5. As can be appreciated from FIGS. 13, coil 1 passes through a central portion of a hollow ring which is composed of a portion of elongated strip 4 and the associated U-shaped strip 5 as shown in FIG. 3(a). As a result, the ring is a basic unit of an electric shield whose size is about h×w×1.

The rings are periodically arranged in Θ-direction of the loop coil 1, when viewed in cylindrical coordinates which also include a "z-direction", i.e., an axis through the center of the loop and vertical to the plane of the loop, and an "r-direction", i.e., a radial direction of the loop, as well as the aforementioned "Θ-direction", i.e., the angular direction of the loop. Therefore, the ring can be considered an electric conductive area portion and the gap an electric non-conductive area portion of the shield. Each of the gaps also can be called "an opening" provided in a conductor sheet formed by strips 4 and 5. There is an electric insulator 6 between the coil 1 and the ring, such as air, an insulator sheet of polyamide (depicted in FIG. 3(a)) and the like.

When R.F. power is supplied to the coil 1, lines of magnetic force extend out through the gaps. Also, lines of magnetic force can even penetrate strips 4 and 5, if the strip thickness is sufficiently thinner than the depth of the skin effect which generally is several tens of micrometers. For example, magnetic line penetration can occur for strip thicknesses of 10 μm or less. If the strips are made of laminated layers, each of the laminated layers is sufficiently thinner than the depth of the skin effect.

Figure 4:
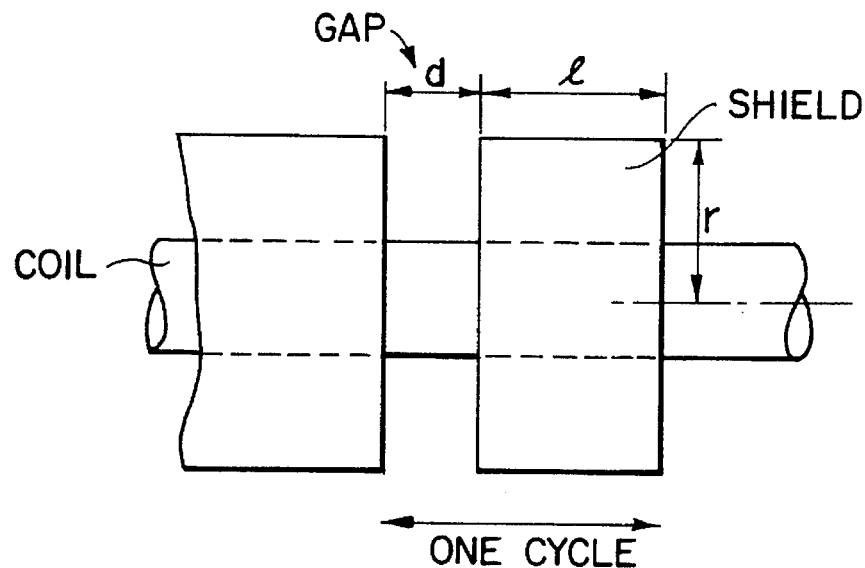
FIG. 4 is a conceptional view of an antenna for a calculation example.

The gap width of "d" is made sufficiently small to prevent plasma from entering through the gap, such as smaller than the Debye length of the plasma. In general, the gap width is preferably about 1 mm or less. However, the total gap area is required to be sufficiently large to produce the desired magnetic field in the chamber. Therefore, the ratio (A) of the gap area to the total of the gap area and the area of the conductive portion of the shield is preferably about 30% or more. Further, this area ratio (A) nevertheless should be sufficiently small to shield the electrostatic field. The ratio (A) is preferably about 70% or less. FIG. 4 shows a calculation example. A shield is constructed from a strip having the width of "1" is spirally wound around a coil leaving a gap of "d" between adjacent turns each of whose radius is "r". The ratio (A) is represented by:

$$A \approx 2\pi r d/2\pi r(1+d) = d/(1+d)$$

In the embodiments depicted in FIGS. 1 to 3, elongated strip 4 is arranged inside of the coil 1. Alternatively, U-shaped strip 5 may be arranged on the inside and, moreover, strip 4 can be arranged anywhere around the coil 1. However, since the density of plasma is higher at the inside of the antenna, the shield may be more effective in the case where elongated strip 4 which is electrically continuous is arranged inside of the coil. Further, strips 4, 5 need not necessarily be at ground potential. As stated previously, these strips can be connected to some other source of electric potential. The electric shield structures as shown in FIGS. 1 to 3 is effective to shield the static electric field caused by the coil.

Figure 5:
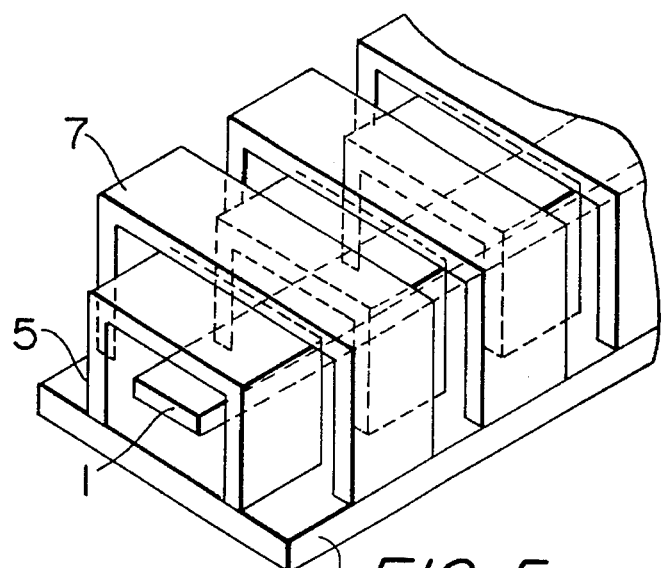
FIG. 5 is a partial view of the antenna of another embodiment of the present invention.
Figure 6A:
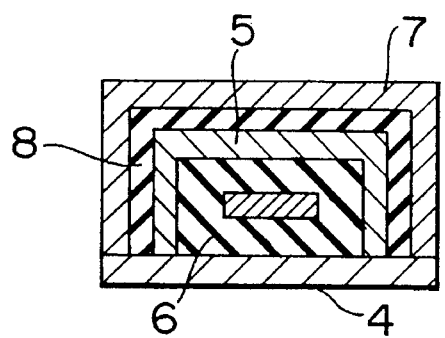
FIG. 6(a) is a sectional view of the antenna of FIG. 5.
Figure 6B:
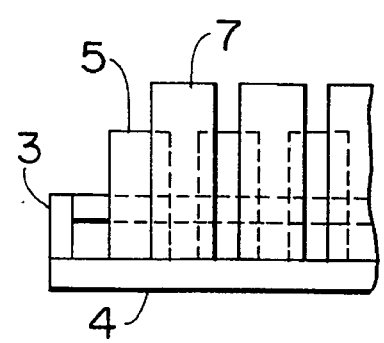
FIG. 6(b) is a side view of the antenna of FIG. 5.

FIGS. 5 and 6 show another electric shield structure. In this structure, each of the gaps formed by U-shaped strips 5 in the embodiment depicted in FIGS. 2 and 3 is covered or "shadowed" with a second U-shaped strip 7. There is an electric insulator 8 between the U-shaped strip 5 and the U-shaped strip 7 which can be the same or different as insulator 6 between the coil 1 and the strip 5. According to this structure, since the coil 1 cannot be "seen" from the outside, any radial component electric static field in the FIGS. 1–3 embodiment caused by the gap can be further reduced. In other words, U-shaped strips 5 and 7 combine to completely shadow loop coil 1. Since the gap concerning the U-shaped strip 5 is covered with the second U-shaped strip 7, the gap width concerning the U-shaped strip 5 is not required to be less than 1 mm. However, the separation distance between the strips 5 which collectively with strip 4 form a shield "under layer" and strips 7 (collectively the "over layer"), i.e., the thickness of insulator 8, is preferably less than a Debye length of the generated plasma, such as about 1 mm or less.

The double shield structure can also be formed by spiral winding a continuous strip sheet around a coil leaving a spiral gap and further winding over the gap leaving a separation distance. This spiral wound construction has essentially the same effect as the structure in FIGS. 5 and 6. In the case of a helical-type of loop coil antenna, namely one having multiple coil turns spaced apart in the Z direction, the continuous strip forming the electric shield can be wound around each turn of the coil or each several turns of the coil.

Figure 7:
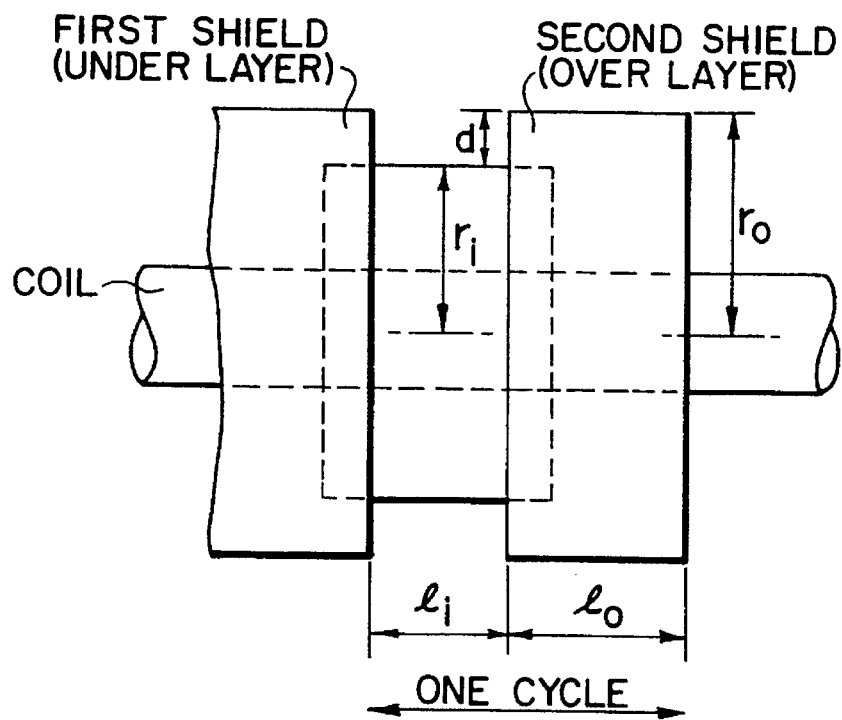
FIG. 7 is a conceptional view of another antenna for a calculation example.

FIG. 7 shows a calculation example for the effective ratio (A) a double shield structure. In FIG. 7, a first shield (under layer) having a radius of "r" is wound around a coil leaving periodic gaps and a second shield (over layer) having a radius of "$r_0$" and a width of "$l_0$" is wound over the first shield with a gap of "$l_i$". The separation distance between the first and second shields is "d". In the case of FIG. 7, the "gap area" is the planar area between the inner and outer shields normal to the separation distance "d" while the total "shield plus gap area" includes the cylindrical areas normal to the $l_i$ and $l_o$ distance directions. Thus, the ratio (A) is represented by:

$$\begin{aligned} A &= 2\pi(r_0^2 - r_i^2)/[2\pi r_i l_i + 2\pi r_0 l_0 + 2\pi(r_0^2 - r_i^2)] \\ &\approx d(r_0 + r_i)/[r_i d_i + r_0 l_0 + d(r_0 + r_i)] \end{aligned}$$

In the case of the double shield structure, the coil cannot be "seen" from the plasma side, and the ratio of the gap area is not limited by the view of the electric shield effect. However, the ratio (A) defined as above for the double shield case is preferably about 30% or more to apply a sufficient magnetic field. Further, the separation distance between an under layer and an over layer forming the double shield structure is preferably about one-tenth or more of a Debye length of the generated plasma, such as about 0.1 mm or more.

Figure 8:
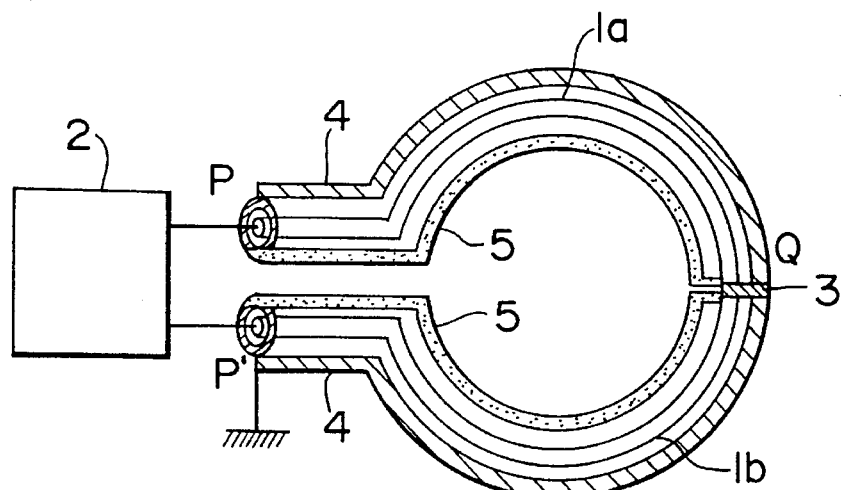
FIG. 8 is an illustrative view of an antenna of yet another embodiment of the present invention.

In the structures discussed thus far, R.F. power is supplied to the antenna at one point, such as point P in FIG. 1. However, power can be supplied to the antenna at two or more points, depending on the coil construction. For example, as shown in FIG. 8, two semicircular coils 1a and 1b can be used. R.F. power is supplied at the points P and P'. At the point Q, the coils 1a, 1b and the strip 4 are electrically interconnected, and the strip 4 is grounded adjacent point P'. Further, the number of turns of the coil may be two or more. In the plural turns case, the shield can be provided to each turn or to groups of several turns. Furthermore, the shielded antenna assembly can be positioned in or out of a chamber.

According to the present invention, a magnetic field is caused by current supplied to the coil, and an inductive electric field is generated by the time change of the magnetic field so as to generate discharge plasma. On the other hand, an electrostatic field due to charges on the coil is shielded by one or more non-magnetic electrically conductive elements toroidally surrounding and partially covering the coil 1, such as the U-shaped strips 5 and elongated strip 4. As a result, contamination of the antenna by the plasma due to the radial component of electrostatic field can be extremely reduced. Further, the electrostatic shield can minimize the rise of the plasma potential.

EXAMPLES

Further, particularly preferred embodiments of the present invention will be described with reference to the accompanying drawings.

Figure 9:
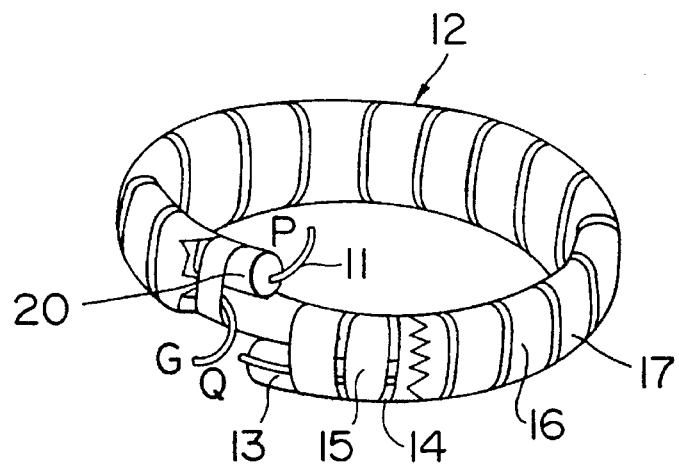
FIG. 9 is a view in perspective of an antenna of still another embodiment of the present invention.

FIG. 9 shows the antenna portion of a first preferred embodiment of a discharge apparatus of the present invention. An electric conductor 11 coated with an insulator 20 of polyethylene is wound twice clockwise to form a two-turn loop antenna 12. A return wire 13 of bare copper wire is electrically connected to end point Q of the conductor 11. The wire 13 is wound once counterclockwise and grounded at a point G. R.F. power is supplied to the antenna 12 at end point P of the conductor 11 from a suitable power source (not illustrated). The diameter of the loop antenna 12 is about 100 mm.

An electrically conductive and non-magnetic sheet 15 of Al having a width of 3 mm and a thickness of 10 μm is wound around the conductor 11 and the wire 13 with gaps 14 of about 2 mm. The conductor 11 is coated with an insulator having a thickness of about 1 mm. Further, an electrically conductive and non-magnetic sheet 16 of Al having the same composition as sheet 15 is wound over the sheet 15 and the gaps 14. Thus, a double winding construction is accomplished with an insulator layer (not illustrated) having a thickness of about 1 mm between the sheet 15 and the sheet 16, such as an insulator coating or an insulator sheet of polyethylene. The ratio (A) corresponding to the FIG. 9 construction is about 30%.

Figure 10:
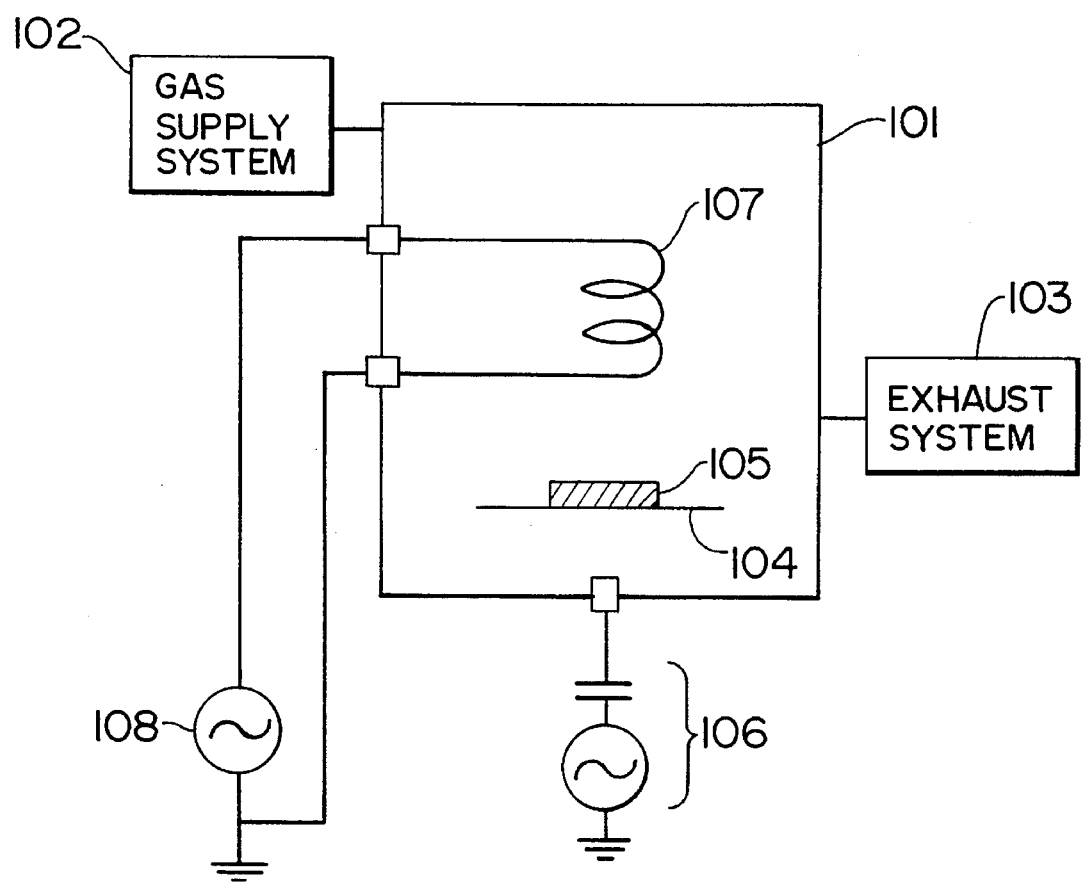
FIG. 10 is a conceptual view of the overall apparatus of an embodiment of the present invention.

FIG. 10 shows a conceptual view of a discharge apparatus. Plasma process chamber 101 is operatively connected to a gas supply system 102 and an exhaust system 103. A stage 104 on which a sample 105 is placed, is positioned in chamber 101. The sample 105 is supplied with a bias by source 106 which is a capacitive coupled R.F. power source. A helical type antenna 107 for generating a high frequency electric field due to a high frequency magnetic field is placed near the stage 104 in the vessel 101. R.F. power is supplied to the antenna by a R.F. power source 108. As stated previously, the above-mentioned antenna 12 in FIG. 9 can be used as the antenna 107 in FIG. 8 as representative of apparatus made in accordance with the present invention. The chamber 101, which can be constructed of an insulator such as quartz glass, alternatively can be made of electrically conductive material to provide a return circuit.

Figure 11B:
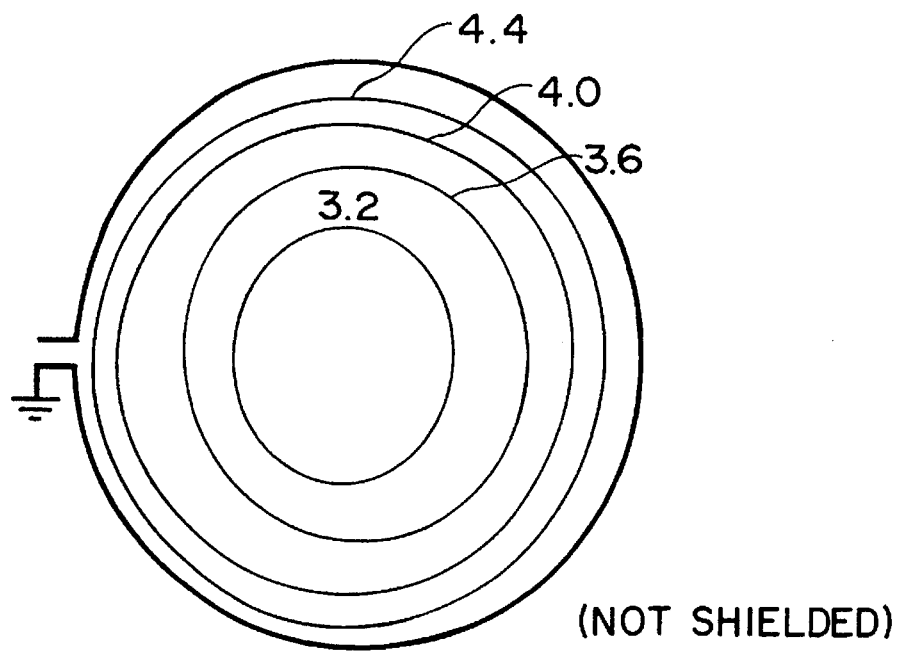
FIG. 11(b) is a schematic graph showing the magnetic field of the embodiment of FIG. 9 with shielding.

FIG. 11(b) shows the two-dimensional distribution of the magnetic field $B_z$ (z-direction component) in air generated by supplying power at 10 MHz. For comparison, FIG. 11(a) shows the same antenna as in FIG. 9 but constructed without the sheets 15 and 16, i.e., with no shielding. The difference is slight between FIGS. 11(b) and (a). As a result, it is understood that the electrostatic shield constructed as in FIG. 9 does not substantially reduce the magnetic field generated by the antenna.

Figure 11B:
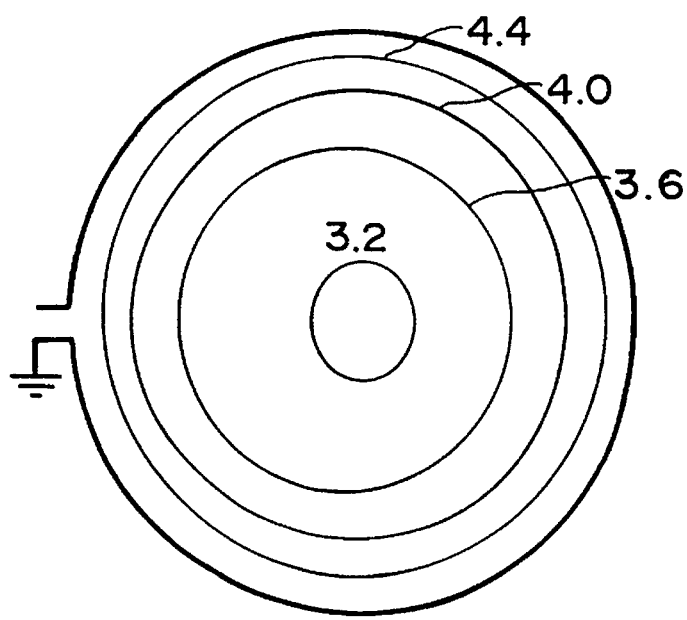
Figure 12A:
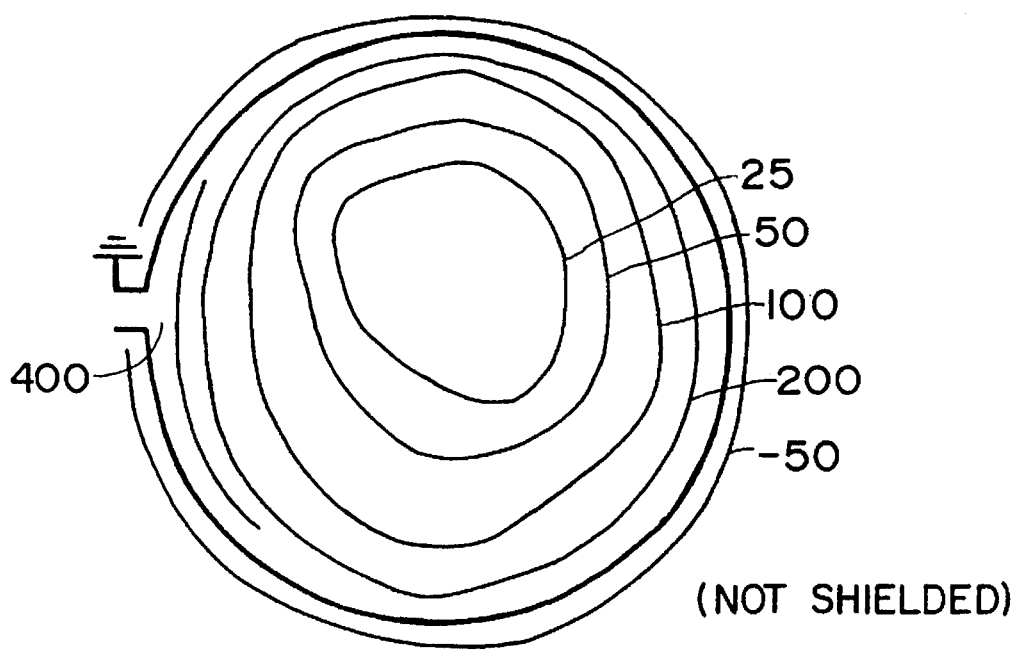
FIG. 12(a) is a schematic graph showing the electric field of the embodiment of FIG. 9 without shielding.
Figure 12B:
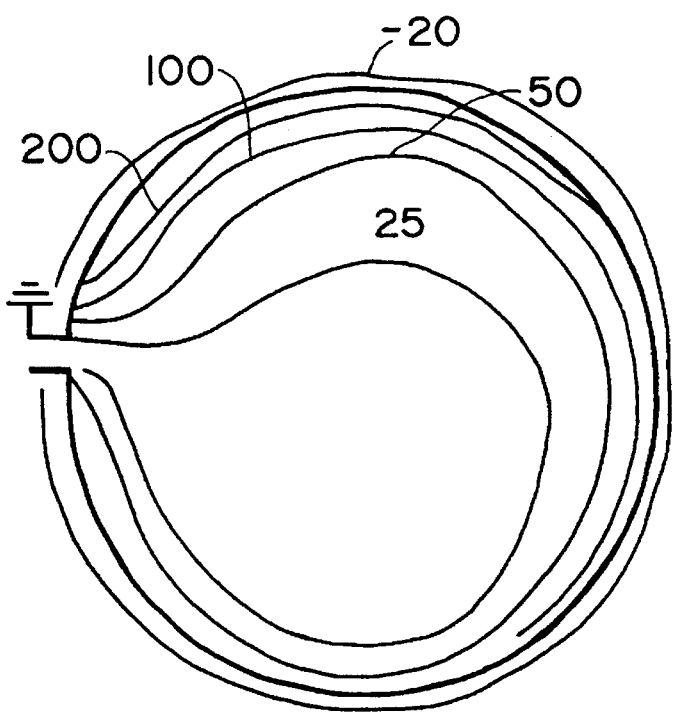
FIG. 12(b) is a schematic graph showing the electric field of the embodiment of FIG. 9 with shielding.

On the other hand, FIGS. 12(a) and (b) show the two-dimensional distribution of the corresponding electric fields $E_r$ (r-direction component). FIG. 12(b) shows the case of the dimensional distribution of the corresponding electric fields FIG. 9 antenna having the electrostatic shield, and FIG. 12(a) shows the case without the shield. The value of $E_r$ were calculated from a slope of the curve of electric potential measured by an electrostatic probe under the same value of $E_r$ near the antenna of FIG. 12(b) is only about half condition in FIG. 11 vs. position in the chamber 101. The that of FIG. 12(a). Especially, at the outside of the antenna, the value of $E_r$ is significantly reduced in the case of FIG. 12(a) (shielded antenna). Therefore, the radial electrostatic field due to the antenna can be reduced effectively without appreciably reducing the magnetic field.

Next, a contemplated plasma etching process is described using the basic apparatus shown in FIG. 10 again with the antenna 12 of FIG. 9 as the antenna 107 of FIG. 10. The article to be etched, such as Si substrate coated by a $SiO_2$ layer of 100 nm and a patterned resist layer thereon, would replace the sample 105. The chamber 101 would be exhausted to about 10 Pa or less and thereafter $CHF_3$ gas supplied to the chamber 101 at a rate of about 200 sccm. As a first step in the etching process, 50 W of R.F. power could be supplied to the sample 105 by the power source 106. Plasma would not be generated and a bias would not be applied to the sample 105 prior to this step. Next, 500 W of R.F. power would be supplied to the antenna 107 by the power source 108, to generate plasma, and the bias voltage of the sample set to −100 V relative to the plasma. After 2 min., etching of $SiO_2$ with a good aspect ratio should be accomplished.

It is expected that if an antenna constructed as in FIG. 9 but without the electrostatic shield would instead be used as the antenna 107 in FIG. 10, the rate of the etching would be reduced with the passage of time, $SiO_2$ would remain after the etching, and the angle of taper would deteriorate. The reason for these deficiencies would be a contaminated plasma caused by "sputtering" of the antenna by ions in the plasma. Specifically, if the $CHF_3$ radical is quenched by the contamination, the etching rate would be reduced and $SiO_2$ would remain. Also, the resist layer would be affected by the contamination. It is further expected that mass peaks of CHF, CH and F would be detected in the vessel by a mass spectrometer in the case using the shielded antenna, but that the detected mass peak of F would be reduced and the mass peak of oxygen increased significantly in the case without the shield.

FIG. 13 shows a main portion of another embodiment of a discharge apparatus made in accordance with the present invention. A hollow stainless pipe 21 having an outer diameter of about 6 mm which can be internally cooled by water flow was helically wound with two and a half clockwise turns relative to the Z direction to form a loop coil and was connected to a power supply (not illustrated) at a point P. Pipe 21 also was helically wound one and a half turns counterclockwise to serve as a return wire and was grounded at a point G. The diameter of the coil was about 70 mm. Several strip sheets of stainless steel 24 each having a width of 15 mm and a thickness of 20 μm were wound around the pipe 21 with gaps of about 5 mm between strips. Each strip sheet 24 was wound around all the turns of the pipe 21 in common with the sheets being spaced from the portion of the pipe 21 comprising the loop coil. The sheets 24 were fixed and electrically connected to the portion of pipe 21 comprising the return wire by spot welding.

In a chamber of stainless steel provided with a surface magnetic field using a permanent magnet, plasma discharge was conducted by using the antenna of FIG. 13 at 4 mTorr of Ar. FIG. 14 shows the plasma potential with respect to input power measured by using a Langmuir probe. For comparison, measured plasma potential for the antenna which did not include the stainless strip sheets 24 is presented in FIG. 14 also. There was no significant difference between the shielded case and the non-shielded case in the density of the plasma. However, at 100 W of input power, the plasma potential of the case providing the stainless strip sheet electric shield is only a half that of the case not providing the stainless sheet electric shield. Further, in the case without the shield, arcing occurred frequently; however in the case using the shield, arcing not occur. The reason why the shield effect is weakened as power rises is believed to be that the antenna is singly shielded and the gap width is relatively wide.

According to the present invention, an inductive coupling type discharge apparatus with a shielded antenna can be obtained, wherein the undesirable radial electric field component $E_r$ is reduced and an unwanted rise of plasma potential is suppressed relative to unshielded apparatus. Therefore, the occurrence of arcing can be avoided. Also, contamination of the plasma can be prevented.

Modifications and variations are possible in light of above teachings or may be acquired from practice of the invention. It is therefore to be understood that within the scope of the appended claims, the invention may be practiced otherwise than as specifically described herein.

What is claimed is:

1. A plasma discharge apparatus usable with a source of R.F. power, the apparatus comprising:
   a chamber in which plasma discharge is to be produced;
   a loop coil antenna formed from an electric conductor and which can be operatively connected to the source of R.F. power, said coil being positioned to produce a high frequency electric field in the chamber;

an electric shield including at least one shielding layer of a non-magnetic electrically conductive material, said layer being electrically connected to the antenna so as to comprise a return circuit and being positioned to surround said coil toroidally, wherein the electric shield comprises an electrically conductive portion and an electrically non-conductive portion; and means for fixing the electric potential of said shield.

2. Apparatus according to claim 1, wherein the electric shield is grounded.

3. Apparatus according to claim 1, wherein the ratio of the electrically non-conductive portion area to the total of the electrically conductive portion area and the electrically non-conductive portion area is about 30% or more.

4. Apparatus according to claim 3, wherein the ratio of the electrically non-conductive portion area to the total of the electrically conductive portion area and the electrically non-conductive portion area is about 70% or less.

5. Apparatus according to claim 1, wherein the electric non-conductive portion comprising at least one opening in the shielding layer.

6. A plasma discharge apparatus usable with a source of R.F. power, the apparatus comprising:

a chamber in which plasma discharge is to be produced;

a loop coil formed from an antenna electric conductor and which can be operatively connected to the source of R.F. power, said coil being positioned to produce a high frequency electric field in the chamber;

an electric shield including at least one strip of a non-magnetic electrically conductive material, said strip being electrically connected to the antenna so as to comprise a return circuit, wherein the strip is wound toroidally around the antenna leaving a spiral gap between neighboring turns of the strip; and means for fixing the electric potential of said shield.

7. Apparatus according to claim 6, wherein the electric shield is grounded.

8. Apparatus according to claim 6, wherein the ratio of the area of said gap to the total of the area of said conductive strip and the area of the gap is about 30% or more.

9. Apparatus according to claim 6, wherein the ratio of the area of said gap to the total of the area of said conductive strip and the area of the gap is about 70% or less.

10. Apparatus according to claim 6, wherein each of said gaps between the neighboring turns of the strip is less than a Debye length of generated plasma.

11. Apparatus according to claim 6, wherein each of said gaps between the neighboring turns of the strip is about 1 mm or less.

12. Apparatus according to claim 6, wherein the toroidally wound strip comprises a conductive underlayer, and wherein the strip is further wound toroidally over the gaps to comprise a conductive overlayer, said overlayer being radially spaced from said underlayer by a separation distance.

13. Apparatus according to claim 12, wherein the separation distance of the strip is about a Debye length of generated plasma or less.

14. Apparatus according to claim 12, wherein the separation distance of the strip is about 1 mm or less.

15. Apparatus according to claim 6, wherein said loop coil antenna includes a plurality of coil turns, and wherein the strip is wound toroidally around two or more coil turns, each strip turn toroidally encompassing each of said two or more coil turns.

16. A plasma discharge apparatus usable with a source of R.F. power, the apparatus comprising:

a chamber in which plasma discharge is to be produced;

a loop coil antenna formed from an electric conductor and which can be operatively connected to the source of R.F. power, said coil being positioned to produce a high frequency electric field in the chamber; and a double layer electric shield including at least one strip of a non-magnetic electrically conductive material, said strip being grounded and connected to the antenna so as to comprise a return circuit, wherein the strip is wound toroidally around the coil leaving gaps between neighboring turns of the strip to comprise a conductive underlayer and further toroidally wound over the gaps to comprise a conductive overlayer, said overlayer being radially spaced from said underlayer by a separation distance.

17. Apparatus according to claim 16, wherein the separation distance is about a Debye length of generated plasma or less.

18. Apparatus according to claim 16, wherein the separation distance is about 1 mm or less.

19. Apparatus according to claim 18, wherein the separation distance is about one-tenth of a Debye length of generated plasma or more.

20. Apparatus according to claim 18, wherein the separation distance is about 0.1 mm or more.

* * * * *